(12) United States Patent
Flowers

(10) Patent No.: US 6,580,197 B2
(45) Date of Patent: Jun. 17, 2003

(54) SYSTEM AND METHOD FOR DISSIPATING STATIC CHARGE GENERATED IN A SURFACE ACOUSTIC WAVE DEVICE

(75) Inventor: James E. Flowers, Dallas, TX (US)

(73) Assignee: Clarisay, Inc., Dallas, TX (US)

( * ) Notice: Subject to any disclaimer, the term of this patent is extended or adjusted under 35 U.S.C. 154(b) by 69 days.

(21) Appl. No.: 09/755,992

(22) Filed: Jan. 5, 2001

(65) Prior Publication Data

US 2002/0089255 A1 Jul. 11, 2002

(51) Int. Cl.$^7$ ............................................. H01L 41/08
(52) U.S. Cl. .................................................. 310/313 R
(58) Field of Search ............................. 310/363, 313 R, 310/313 B; 333/155, 193; 29/25.35

(56) References Cited

U.S. PATENT DOCUMENTS

| | | | | | |
|---|---|---|---|---|---|
| 4,381,469 A | * | 4/1983 | Ogawa et al. | .......... | 310/313 R |
| 4,684,841 A | * | 8/1987 | Este et al. | .............. | 310/313 B |
| 5,889,446 A | * | 3/1999 | Yamada et al. | ............. | 333/193 |
| 6,377,138 B1 | * | 4/2002 | Takagi et al. | ............... | 333/193 |

* cited by examiner

*Primary Examiner*—Thomas M. Dougherty
*Assistant Examiner*—Karen B Addison

(57) ABSTRACT

A surface acoustic wave (SAW) device, a method of manufacturing the same and a SAW filter having at least one SAW device. In one embodiment, the SAW device includes: (1) a piezoelectric substrate, (2) a conductive layer located over the piezoelectric substrate and (3) a resistor, coupled between a portion of the conductive layer and the piezoelectric substrate, that forms a return path for static charge migrating from the piezoelectric substrate to the conductive layer.

21 Claims, 4 Drawing Sheets

SYSTEM AND METHOD FOR DISSIPATING STATIC CHARGE GENERATED IN A SURFACE ACOUSTIC WAVE DEVICE

TECHNICAL FIELD OF THE INVENTION

The present invention is directed, in general, to surface acoustic wave (SAW) devices and, more specifically, to a system and method for dissipating static charge generated in a SAW device.

BACKGROUND OF THE INVENTION

Electronic signal processing by means of surface acoustic wave (SAW) devices has been widely adopted by the electronics industry. Such SAW devices can be designed to operate as analog electrical filters that operate at over a wide range of frequencies and have several advantages over conventional technologies. One such advantage is that they can be designed to provide complex signal processing in a single unit. Saw devices also benefit from the ability to be mass produced using semiconductor microfabrication techniques which produces highly uniform devices at a substantially reduced cost. SAW devices can be easily integrated into many digital communications systems and designed to operate in high harmonic modes in the gigahertz (GHz) frequency range.

The response characteristics of a particular SAW device are governed by several factors. One is the geometry of conductors laid out on the SAW resonator's piezoelectric substrate. A typical geometry for a SAW resonator includes first and second SAW finger sets. Portions of the finger sets are interdigitated in a central region of the SAW resonator and are employed to generate or attenuate acoustic waves. Additional non-interdigitated finger sets lie outside of the central region and serve to reflect acoustic waves back into the central region. Proper operation and containment of the acoustic waves require precise construction of both the central and outlying regions.

The interdigitated finger sets act as input and output signal ports when an AC voltage is applied to the signal input portion of the metal lines. Application of an appropriate input electrical AC signal provides the stimulus to create an acoustic wave that may typically be a Rayleigh wave with motion confined to about one acoustic wavelength under the free surface of the piezoelectric substrate. Alternatively, the acoustic excitation may be a "leaky wave," which also finds application in modern radio frequency devices. This wave is propagates to the receiver portion. The fingers corresponding to the signal receiving portion draw energy from the acoustic wave in the lattice and convert it into a filtered electrical signal.

However, effective operation at high frequencies and general reduction in device size require a SAW resonator with smaller, more closely spaced finger sets. An undesirable effect of these small geometries in that the metal lines forming the finger sets become subject to failure. One particularly troublesome mechanism of failure results from formation of mobile charge carriers in the piezoelectric substrate. This phenomenon is particularly troublesome during heating cycles of the manufacturing process. Once present, these charge carriers may then migrate to the metal lines of the finger sets and accumulate at areas of low potential, such as defect sites. If the charge carriers accumulate sufficiently, arcing occurs, damaging or destroying the ability of the interdigitated finger sets to transmit and detect the surface acoustic wave is desired.

Accordingly, what is needed in the art is a surface acoustic wave device and a method of manufacturing a surface acoustic wave device that reduces or eliminates the damage to the device resulting from charge carriers in the substrate.

SUMMARY OF THE INVENTION

To address the above-discussed deficiencies of the prior art, the present invention provides a SAW device, a method of manufacturing the same and a SAW filter having at least one SAW device. In one embodiment, the SAW device includes: (1) a piezoelectric substrate, (2) a conductive layer located over the piezoelectric substrate and (3) a resistor, electrically coupling a portion of the conductive layer and the piezoelectric substrate, that forms a return path for static charge migrating from the piezoelectric substrate to the conductive layer.

The present invention is based in part on the recognition that piezoelectric and pyroelectric effects inherent in the piezoelectric substrate manifest themselves during the manufacture of a SAW device by generating charge carriers. These charge carriers migrate from the substrate to the overlying conductive layer and collect at points of low electrical potential. If the density of these charge carriers reaches a threshold, an electrical arc may be formed that could harm or destroy part of the conductive layer or the substrate. This may render the device inoperative.

In response to this recognition, the present invention provides a convenient return path from the conductive layer back to the underlying substrate. In one embodiment, the conductive path takes the form of a resistive layer coupling the conductive layer and the substrate. The resistance presented by the resistor should (but need not) be sufficiently small to prevent a harmful collection of charge carriers in the conductive layer, but sufficiently large so as not materially to impair subsequent operation of the SAW device.

In one embodiment of the present invention, the piezoelectric substrate comprises one selected from the group consisting of: (1) bismuth germanium oxide, (2) gallium arsenide, (3) lithium borate, (4) lithium niobate, (5) lithium tantalate, (6) langasite, (7) lead zirconium tantalate, and (8) quartz. Those skilled in the pertinent art will understand that other materials may be suitable for use as a substrate, depending upon a particular application.

In one embodiment of the present invention, the conductive layer comprises one selected from the group consisting of: (1) aluminum, (2) copper, (3) gold, (4) silver, (5) platinum and (6) palladium. Those skilled in the pertinent art will understand that other materials may be suitable for use as a conductive later, depending upon a particular application.

In one embodiment of the present invention, the resistor comprises a serpentine trace containing a material selected from the group consisting of: (1) titanium, (2) zirconium, (3) hafnium, (4) vanadium, (5) niobium, (6) tantalum, (7) molybdenum, (8) tungsten, (9) chromium, (10) nitrides thereof and (11) carbides thereof. Those skilled in the pertinent art will understand that other materials may be suitable for use as a resistor layer, depending upon a particular application.

In one embodiment of the present invention, the resistor couples a selected signal pad to one of a plurality of ground pads. In a more specific embodiment of the present invention, the SAW device comprises two signal pads and four ground pads and the resistor is divided into portions that span the two signal pads and the four ground pads.

In one embodiment of the present invention, the resistor electrically couples an entirety of a pad portion of the conductive layer and the piezoelectric substrate.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
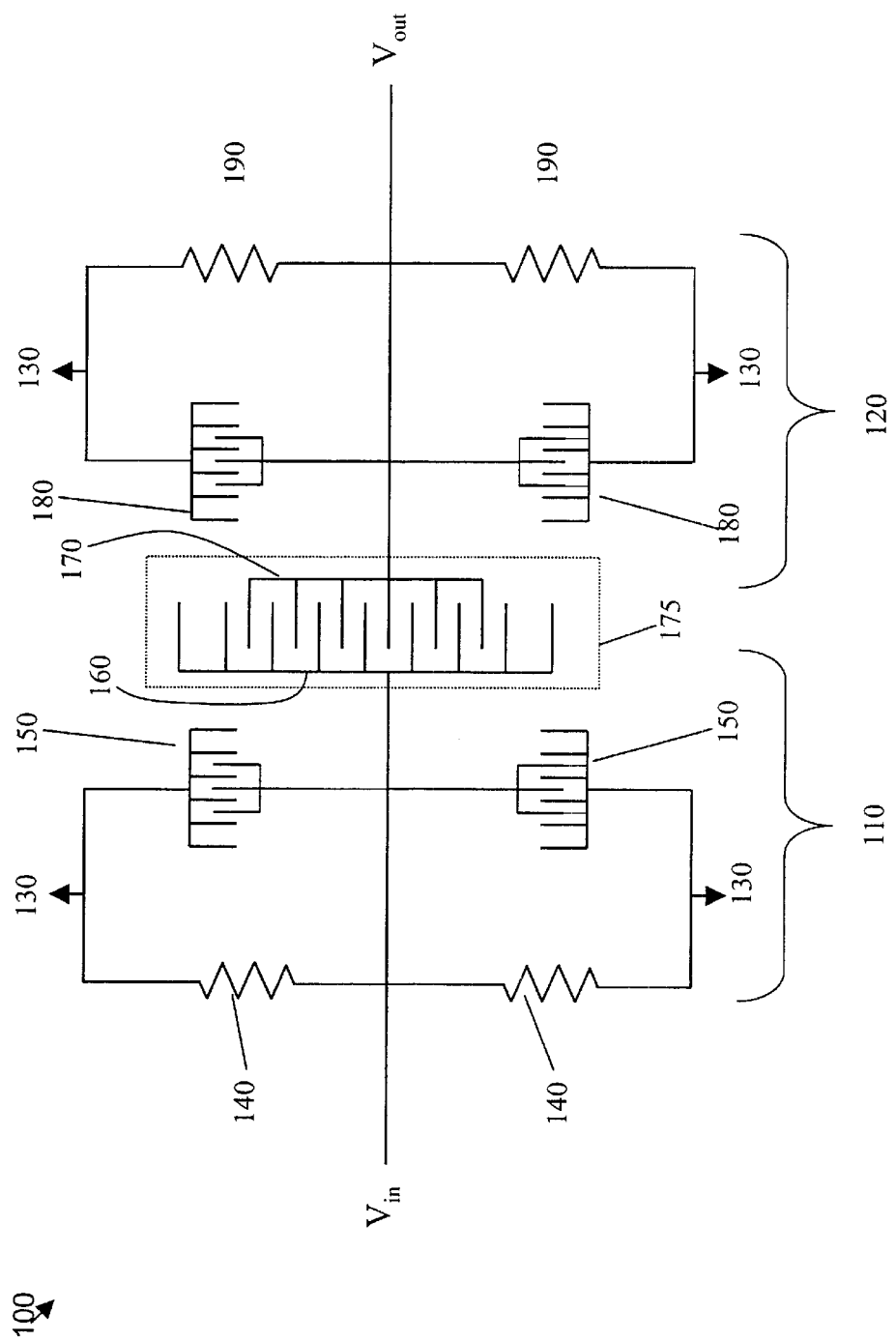
FIG. 1 illustrates a schematic diagram of a circuit of a SAW filter constructed according to the present invention.

Referring initially to FIG. 1, illustrated is a schematic diagram of a circuit 100 of a SAW filter constructed according to the principles of the present invention. The circuit 100 includes an input signal pad 110 configured to receive an AC input voltage $V_{in}$, an output signal pad 120, and ground pads 130. The input pad 110 may include input resistors 140 coupled in parallel to secondary input SAW filter devices 150 and a primary SAW resonator element 160. The output signal pad 120 conducts an output voltage $V_{out}$ and includes a primary SAW receiving element 170 coupled in parallel to secondary output SAW filters 180 and output resistors 190.

The primary SAW resonator element 160 and the primary SAW receiving element 170 form a primary SAW filter device 175 on a piezoelectric substrate. The AC input voltage, $V_{in}$, is modified by the secondary SAW devices allowing the desired AC signal to reach the primary SAW resonator 160. The input voltage is converted to a SAW that transmits the input signal to the SAW receiver element 170. The AC resulting output signal may then be further modified by the secondary output SAW devices 180. It is highly desirable that the resistors 140, 190 not deleteriously affect the input and output signals.

Operating characteristics of the primary SAW filter 175, the secondary SAW devices 150, 180 and the resistor elements 140, 190 may be selected to tailor the frequency response characteristics of the SAW filter 100. The presence of the resistor elements 140, 190 provides convenient return pathways for static charge carriers accumulated in the common piezoelectric substrate by directing DC portions of the signal to the common electrical ground while allowing desired portions of the AC signal to pass through the primary SAW filter 175.

Figure 2:
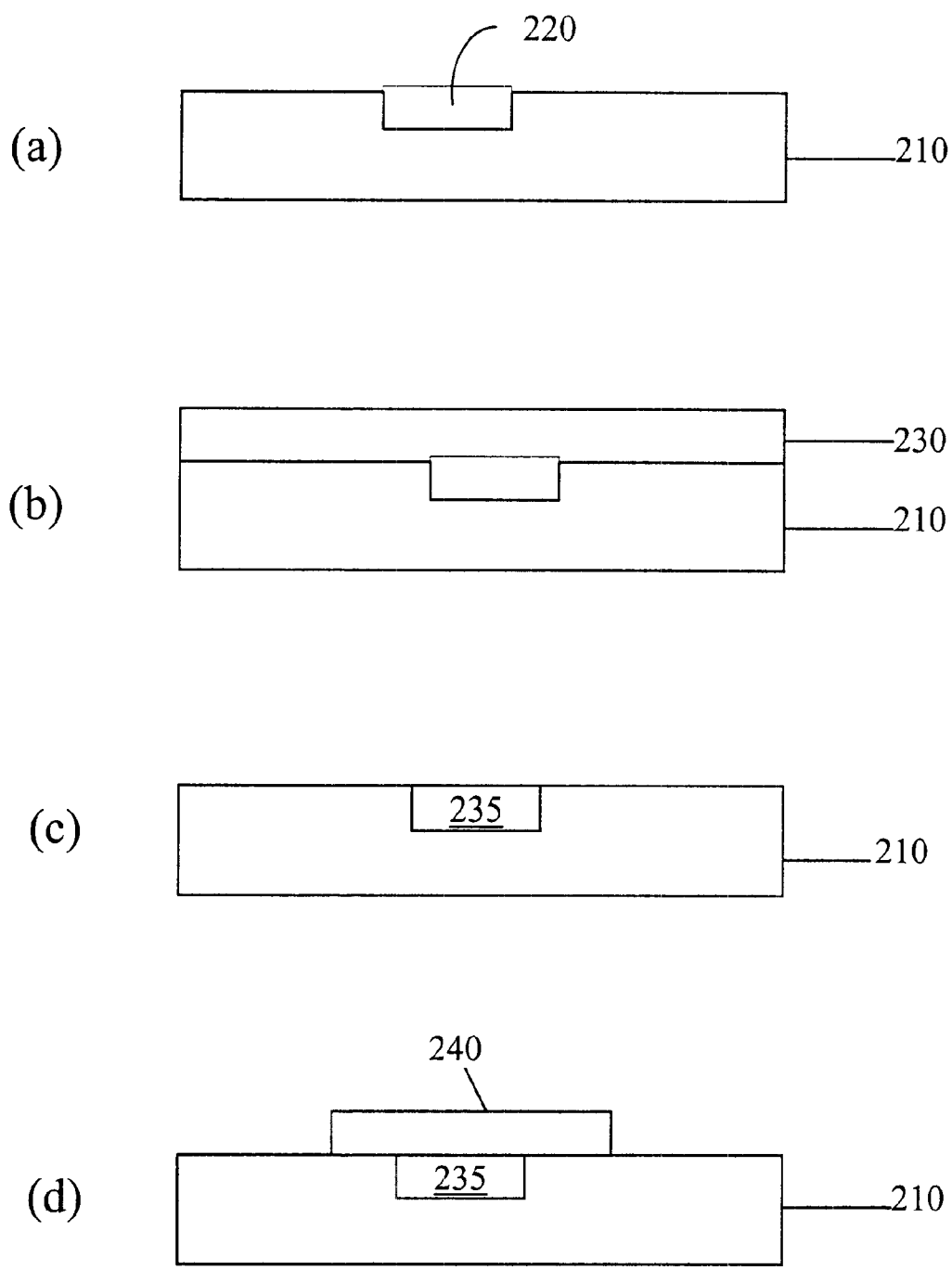
FIG. 2 illustrates a schematic cross-sectional view of an embodiment of a portion of the circuit 100 including a SAW filter constructed according to the principles of the present invention.

Turning now to FIG. 2, illustrated is a cross-sectional view of an embodiment of a portion of the circuit 100 including a SAW filter constructed according to the principles of the present invention. While FIG. 2 illustrates a portion of the circuit 100, one skilled in the art will understand that other portions of the circuit 100 may be constructed analogously. In such an embodiment there is a piezoelectric substrate 210. In an advantageous embodiment the piezoelectric substrate may be formed of lithium tantalate. In other embodiments the substrate may be bismuth germanium oxide, gallium arsenide, lithium borate, lithium niobate, lithium tantalate, langasite, lead zirconium tantalate, quartz, any combination thereof, or any material there including. One skilled in the art will understand that other piezoelectric materials, whether now-known or later-discovered, may serve as a suitable substrate, depending upon a particular application are not outside the scope of the present invention. In some embodiments, the substrate may take the form of a crystalline wafer.

With reference now to FIGS. 2a–c, in an embodiment of the present invention, the piezoelectric substrate 210 is masked and etched to form cavity 220. A layer 230 of resistive material may be formed over the mask and within each cavity 220. The resistive layer 230 may be deposited by variety of techniques including chemical vapor deposition and physical vapor deposition. Such methods are well known to those skilled in the art. If necessary, undesired portions of resistive layer 230 may be removed, desirably leaving the resistor 235 substantially in the cavity 220, as shown in FIG. 2c. In one embodiment such removal is achieved by chemical mechanical polishing. In an advantageous embodiment cavity 220 form a serpentine pattern, thereby producing resistor 235 having a serpentine pattern. However, other designs and other methods for forming the resistor as depicted in FIG. 2c will be apparent to those skilled in the art and are within the scope of the invention. It will be appreciated that while one resistor 235 has been depicted, other resistors in circuit 100 may be formed analogously during the same step as resistor 235 or at other process steps as desired.

In particularly advantageous embodiments, the resistor 235 may be tungsten. However, any material that, as formed, serves to conduct DC current to a ground pad will be suitable. Other examples of suitable materials for resistor 235 include doped silicon, titanium, zirconium, hafnium, vanadium, niobium, tantalum, molybdenum and chromium. The resistor may also include nitrides or carbides of the above mentioned materials. Where the resistor 235 includes a nitride or carbide, it may be formed by deposition of the metal in the presence of a reactive nitrogen or carbon source in the forming gas. In other embodiments, a resistor may be formed by first depositing the metal followed by reaction to form the carbide or nitride. These methods will be known to those skilled in the pertinent art who will also understand that other materials may be suitable for use as a resistor 235, depending upon a particular application.

Whatever material is chosen, resistor 235 should be formed to have certain characteristics. The resistor 235 should allow desired portions of an AC signal to pass substantially unhindered. However, resistor 235 should also be capable of directing undesired static charges to the common electrical ground to which the resistor is connected. In particular embodiments the common electrical ground may be one or more bond pads. The signal directing characteristics may depend on the intrinsic properties, such as resistivity, of the material comprising the resistor layer as well as the overall size and thickness of the regions. One skilled in the art may experimentally determine these characteristics to optimize the behavior of the device for a desired application.

Referring to FIG. 2d with continuing reference to FIG. 1, conductive layer 240 is formed over at least a portion of the substrate surface and the resistor 235. Methods for forming such conductive layers are well known in the art. The conductive layer 240 may include an input SAW resonator element 160, a SAW receiving element 170. In other embodiments the conductive layer may form one or more secondary input SAW filter devices 150. Conductor layer 240 may also form one or more secondary output SAW filter 180 as well as the $V_{in}$ or $V_{out}$ traces. Methods of forming such resonator elements for SAW devices are well known to those skilled in the art. In such embodiments where the conductive layer 240 may also include secondary SAW devices, the layer 240 may be electrically connected to SAW resonator element 160 or SAW receiving element 170. In one embodiment of the present invention, the conductive layer 240 includes aluminum. However, the conductive layer 240 may also include materials such as copper, gold, silver, platinum and palladium. Those skilled in the pertinent art will understand that other materials may be suitable for use as a conductive later, depending upon a particular application.

Figure 3:
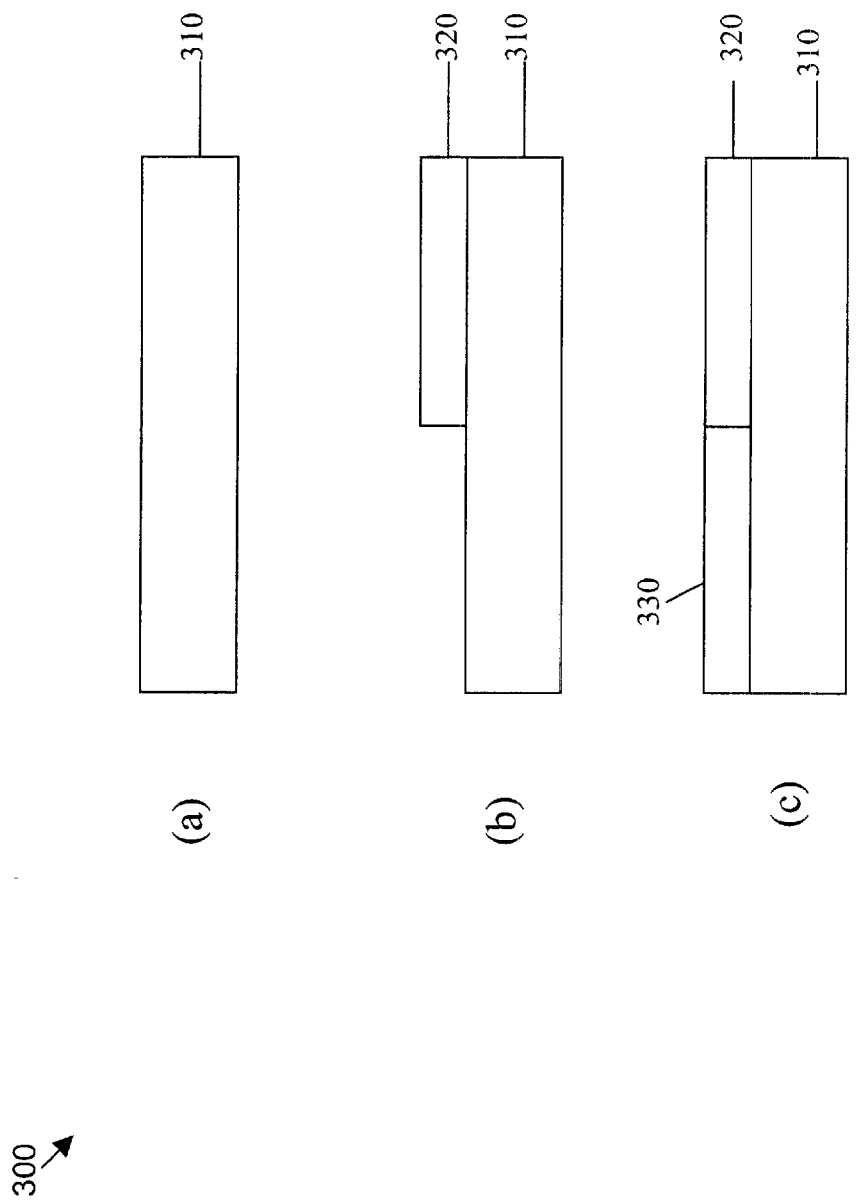
FIG. 3 illustrates a schematic representation of an embodiment of a resistor formed according to the principles of the present invention.

Referring now to FIG. 3, there is depicted a schematic representation of an alternate embodiment of the present invention wherein one or more resistors may be formed on the same level of the device as the conductive layer. In such an embodiment a resistor 320 is desirably formed on the substrate 310. Conductive layer 330 is formed to be electrically connected the piezoelectric substrate 310 through resistor 320. One skilled in the art understands the general methods of microelectronic semiconductor fabrication that may be used to form a device having a resistor 320 on the same level as the conductor layer 330 and electrically connecting the conductor layer 330 to the piezoelectric substrate 310. One skilled in the art will appreciate that electrical connection of the conductive layer 330 and substrate 310 and through a resistor may be achieved in a variety of other configurations, such as interlayer vias, or contact plugs. Such configurations are within the scope of the present invention.

It will be appreciated that however the resistors and conductor layer may be formed, the resistors direct spurious charge that may develop in the substrate to electrical while allowing desired portions of an AC signal to pass substantially unhindered through the conductive layer.

Figure 4:
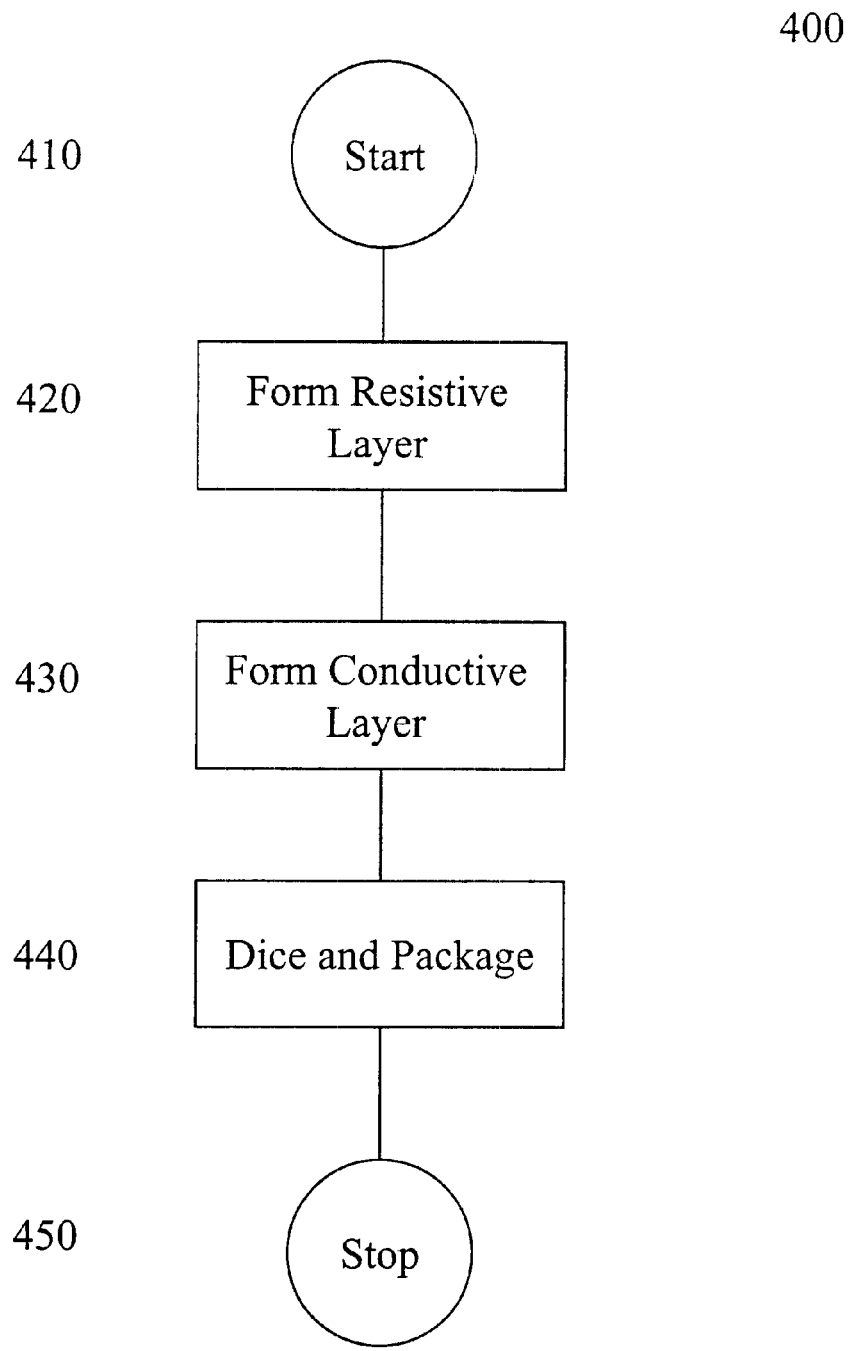
FIG. 4 illustrates a flow diagram a process for forming an embodiment of a SAW device according to the principles of the present invention.

Turning now to FIG. 4, illustrated is a flow diagram of a process, generally designated 400, for forming a SAW device according to the principles of the present invention. The process 400 begins at a start step 410 where the substrate is positioned. An action step 420 includes forming one or more resistors, which may include forming one or more cavities. The action step 430 also includes forming the conductive layer and electrically connecting the conductive layer to the substrate through the resistor. One skilled in the art understands that forming the conductive layer may require first patterning a photoresist, next depositing a metal and etching the photoresist. A second etch step may be required to refine the structure of the conductive layer. Other steps that may be included in the action step 430, such as flux coating and flux curing, are known to those skilled in the art. After forming the conductive layer, the action step 440 includes wafer-dice, die-attach, die-cut and packaging steps. The process is completed a stop step 450.

By this design and method, one or more resistors serve to conduct spurious charge generated in the piezoelectric substrate away from the conductive layer of a SAW device. By conducting the charge away from the conductive layer, the charge may be discouraged from accumulating on the finger sets of the SAW elements and thereby reduce the damaging effects that such charge accumulation may produce.

Although the present invention has been described in detail, those skilled in the art should understand that they can make various changes, substitutions and alterations herein without departing from the spirit and scope of the invention in its broadest form.

What is claimed is:

1. A surface acoustic wave (SAW) device, comprising:

a piezoelectric substrate;

a conductive layer located over said piezoelectric substrate; and a resistor located in said piezoelectric substrate, electrically connecting a portion of said conductive layer and said piezoelectric substrate, that forms a return path for static charge migrating from said piezoelectric substrate to said conductive layer.

2. The SAW device as recited in claim 1 wherein said piezoelectric substrate comprises one selected from the group consisting of:

bismuth germanium oxide, gallium arsenide, lithium borate, lithium niobate, lithium tantalate, langasite, lead zirconium tantalate, and quartz.

3. The SAW device as recited in claim 1 wherein said conductive layer comprises one selected from the group consisting of:

aluminum, copper, gold, silver, platinum, and palladium.

4. The SAW device as recited in claim 1 wherein said resistor comprises a serpentine trace containing a material selected from the group consisting of:

titanium, zirconium, hafnium, vanadium, niobium, tantalum, molybdenum, tungsten, chromium, nitrides thereof, and carbides thereof.

5. The SAW device as recited in claim 1 wherein said resistor couples a selected signal pad to one of a plurality of ground pads.

6. The SAW device as recited in claim 1 wherein said resistor electrically couples an entirety of a pad portion of said conductive layer and said piezoelectric substrate.

7. The SAW device as recited in claim 1 wherein said SAW device comprises two signal pads and four ground pads and said resistor is divided into portions that span said two signal pads and said four ground pads.

8. A method of manufacturing a surface acoustic wave (SAW) device, comprising:
   providing a piezoelectric substrate;
   forming a conductive layer over said piezoelectric substrate; and
   creating a resistor in said piezoelectric substrate, electrically coupling a portion of said conductive layer and said piezoelectric substrate, said resistor forming a return path for static charge migrating from said piezoelectric substrate to said conductive layer.

9. The method as recited in claim 8 wherein said piezoelectric substrate comprises one selected from the group consisting of:
   bismuth germanium oxide,
   gallium arsenide,
   lithium borate,
   lithium niobate,
   lithium tantalate,
   langasite,
   lead zirconium tantalate, and
   quartz.

10. The method as recited in claim 8 wherein said conductive layer comprises one selected from the group consisting of:
   aluminum,
   copper,
   gold,
   silver,
   platinum, and
   palladium.

11. The method as recited in claim 8 wherein said resistor comprises a serpentine trace containing a material selected from the group consisting of:
   titanium,
   zirconium,
   hafnium,
   vanadium,
   niobium,
   tantalum,
   molybdenum,
   tungsten,
   chromium,
   nitrides thereof, and
   carbides thereof.

12. The method as recited in claim 8 wherein said creating comprises coupling said resistor to a selected signal pad and one of a plurality of ground pads.

13. The method as recited in claim 8 wherein said creating comprises creating said resistor electrically coupled to an entirety of a pad portion of said conductive layer and said piezoelectric substrate.

14. The method as recited in claim 8 wherein said SAW device comprises two signal pads and four ground pads and said resistor is divided into portions that span said two signal pads and said four ground pads.

15. A surface acoustic wave (SAW) device, comprising:
   a piezoelectric substrate;
   a conductive layer located over said piezoelectric substrate and forming a network of cooperating SAW devices; and
   a resistor located in said piezoelectric substrate, electrically coupling a portion of said conductive layer and said piezoelectric substrate, that forms a return path for static charge migrating from said piezoelectric substrate to said conductive layer.

16. The SAW filter as recited in claim 15 wherein said piezoelectric substrate comprises one selected from the group consisting of:
   bismuth germanium oxide,
   gallium arsenide,
   lithium borate,
   lithium niobate,
   lithium tantalate,
   langasite,
   lead zirconium tantalate, and
   quartz.

17. The SAW filter as recited in claim 15 wherein said conductive layer comprises one selected from the group consisting of:
   aluminum,
   copper,
   gold,
   silver,
   platinum, and
   palladium.

18. The SAW filter as recited in claim 15 wherein said resistor comprises a serpentine trace containing a material selected from the group consisting of:
   titanium,
   zirconium,
   hafnium,
   vanadium,
   niobium,
   tantalum,
   molybdenum,
   tungsten,
   chromium,
   nitrides thereof, and
   carbides thereof.

19. The SAW filter as recited in claim 15 wherein said resistor couples a selected signal pad to one of a plurality of ground pads.

20. The SAW filter as recited in claim 15 wherein said resistor couples an entirety of a pad portion of said conductive layer and said piezoelectric substrate.

21. The SAW filter as recited in claim 15 wherein said SAW device comprises two signal pads and four ground pads and said resistor is divided into portions that span said two signal pads and said four ground pads.

* * * * *

UNITED STATES PATENT AND TRADEMARK OFFICE
Certificate

Patent No. 6,580,197 B2

Patented: June 17, 2003

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: James E. Flowers, Dallas, TX (US); Martin Ivie, Allen, TX (US); and Marc-Andre Schwab, Dallas, TX (US).

Signed and Sealed this Tenth Day of February 2009.

QUYEN LEUNG
*Supervisory Patent Examiner*
Art Unit 2834